June 3, 1952 H. T. LYMAN 2,598,810

WIDE RANGE HIGH-FREQUENCY TUNER

Filed Aug. 4, 1950

Harold T. Lyman INVENTOR.

BY

Dawson and Ooms

ATTORNEYS

Patented June 3, 1952 2,598,810

UNITED STATES PATENT OFFICE 2,598,810

WIDE RANGE HIGH-FREQUENCY TUNER

Harold T. Lyman, Milford, Conn., assignor to Aladdin Industries, Incorporated, Chicago, Ill., a corporation of Illinois Application August 4, 1950, Serial No. 177,690

3 Claims. (Cl. 250—40)

Figure 1:
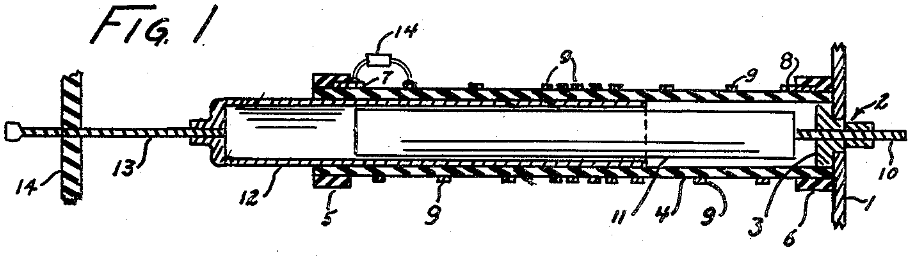

My invention relates to an improved tuner for high frequencies, especially the present television channels, characterized by a relatively wide frequency coverage with tuning movement.

The frequency spectrum in current use for television purposes comprises two spaced bands, one band extending from 54 to 88 mc. (channels 2 to 6) and the other band extending from 174 mc. to 216 mc. (channels 7 to 13). The channel center frequencies extend from 57 to 213 mc. This very large frequency spread of almost four to one, together with the fact that the tuner must accommodate substantial fixed circuit and tube capacitances, demands a tuner having a very large range of variation. Moreover in tuners for television use it is desirable to provide the desired degree of selectivity over the entire spread of each band. It is also essential in a television tuner to provide a device that covers the required frequency spread without spurious responses to unwanted station-carrying frequencies.

One effective means of obtaining the requisite broad frequency coverage and other desirable characteristics in a television tuner is the structure of U. S. Patent No. 2,533,810, granted December 12, 1950 to F. N. Jacob, et al., assigned to the same assignee as the present invention. This structure comprises a coil having an intermediate portion of relatively great turn density and end portions of relatively low turn density. A high frequency core is located in the coil and is telescoped by a low loss conducting sleeve for tuning action.

While the above tuner can be designed to cover the full television range, such design involves the use of relatively high permeability cores, with the consequent increased losses as compared with a tuner using cores of lower permeability. Alternatively, occasions arise where it is desirable to increase the range of even the above tuner without using a core of greater permeability.

In accordance with the present invention the tuning range of a tuner of the aforementioned type is increased at both ends of the tuning range by the use of a capacitor shunting a portion of the turns adjacent the end into which the tuning sleeve is moved for tuning. It would be expected from analysis that this expedient would simply lower the tuning frequency over the entire range or at most lower the lowest tuning frequency without significantly altering the tuning at the higher frequencies. Contrary to this expected performance, however, the capacitor not only lowers the frequency at the low frequency end of the scale but, in addition, raises the tuning frequency at the high end of the scale, thereby significantly extending the range in both directions.

The reason why this action is contrary to the usual type of coil capacity loading is that the action of the sleeve in short-circuiting the tapped portion reduces the capacity loading on the entire coil by lowering the inductance of that portion. Furthermore, in the low frequency band the tapped portion is on the inductive side of resonance, the tapped portion effective inductance is increased by the capacity, and, therefore, the entire coil inductance is increased. In the high frequency band the tapped portion is above its resonance, the tapped portion therefore acting as a capacitor in series with the inductance of the remainder of the coil, and therefore the inductance of the entire coil is decreased. This effective lowering of the inductance in the high band and the effective raising of the inductance in the low band increases the tuning range of the coil and in the tuner in which it is employed, it makes possible more nearly shunt tuning than is otherwise possible.

In a tuner employing partial series and partial shunt tuning the voltage developed by an R. F. amplifier splits between the series capacity and the tube capacity being tuned by the variable coil inductance. Therefore, the more nearly full shunt tuning that can be employed, the more nearly is the total voltage applied across the tube capacity and therefore the higher the gain developed by the tube. The wide range tuning coil described herein permits a larger series fixed capacity and correspondingly lower series reactance and thereby raises the gain more than the gain is lowered by the capacity loading effect.

Taking the numerical case of a television tuner in which it was previously necessary to use a 4.7 mmf. series capacitor in order to permit covering the entire television bands, the use of the tapped coil permitted this capacitor to be raised to 18 mmf., thereby making the tuning almost completely shunt, since the tube input capacity being tuned was in the order of 4 mmf. The effective capacity loading across the entire coil was $(1/9)^2=1/81$ times the one-turn tapped 100 mmf. capacitor=1.2 mmf. The effective increase in gain was therefore about 25 per cent in one circuit alone. When similar gains are made in other circuits, the tuner gain is raised substantially.

The sleeve motion is accountable for the reduction in the capacity loading at the high end of the television bands, since, as was pointed out above, it reduces the fraction of the inductance so loaded.

Moreover, it has been found that the tuner with a capacitor connected across a portion of the turns adjacent the end into which the tuning sleeve moves can be designed to operate effectively over the television bands without appreciable spurious response to undesired signals.

It is therefore a general object of the present invention to provide an improved high frequency tuner characterized by a wide range of tuning frequency with adjustment of the movable member.

Another object of the present invention is to provide an improved high frequency tuner of the type employing a high frequency core within the inductor and a conducting sleeve movable into and out of the annular space defined by the core and coil and capable of covering the full television tuning range with a core of relatively low permeability.

Yet another object of the present invention is to provide an improved tuner for television use characterized by a wide frequency spread even with relatively low permeability core materials and freedom from spurious response over the entire range of each of the television frequency bands.

Figure 2:
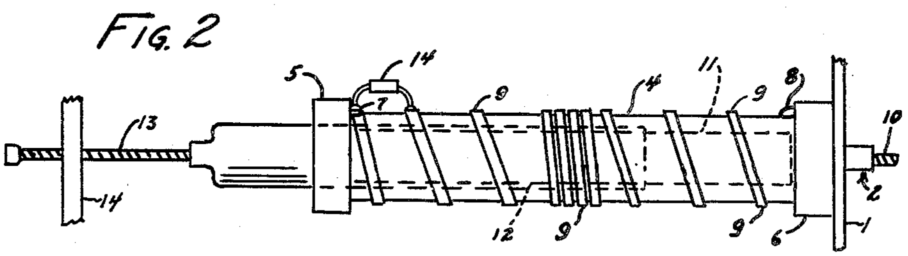
Figure 3:
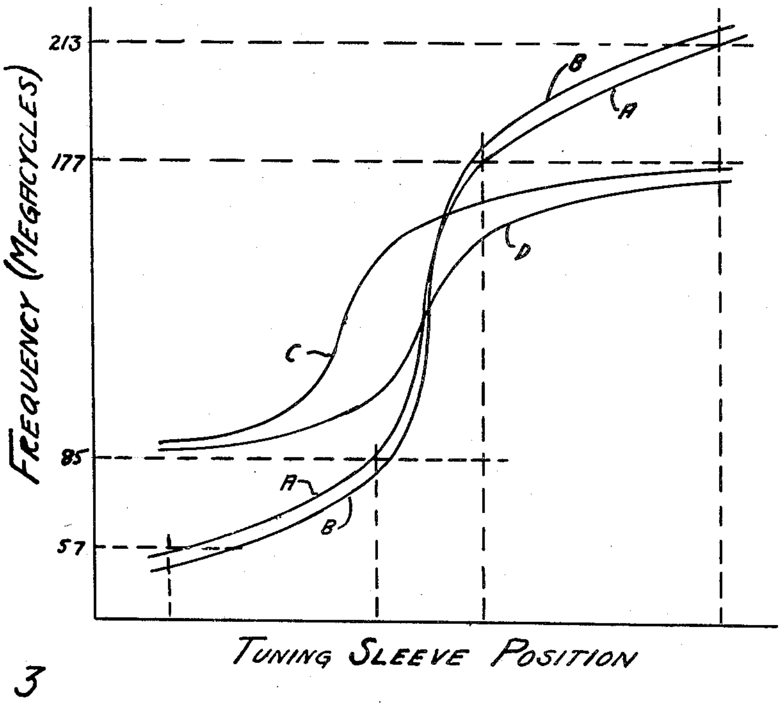

The novel features which I believe to be characteristic of my invention are set forth with particularity in the appended claims. My invention itself, however, both as to its construction and mode of operation, together with further objects and advantages thereof, will best be understood by reference to the following description taken in connection with the accompanying drawings, in which:

Figures 1 and 2 are elevational and axial cross-sectional views of the tuner, respectively; and, Figure 3 is a graph showing the performance thereof.

Referring now to the figures, there is shown at 1 a supporting member, such as a panel of plastic insulating material, which receives an insert or plug 2 of copper or similar material having a protruding portion 3 of generally cylindrical shape with external longitudinal ribs. An insulating sleeve 4 of plastic material, such as a phenolic resin, is snugly received over the portion 3 of the plug 2 to be held in a perpendicular position on the panel 1.

The sleeve 4 receives a pair of washers or sleeves 5 and 6 of similar insulating material on its opposite ends. These are received tightly about the sleeve 4 and a pair of connecting tabs, 7 and 8, secured between the sleeve 4 and the sleeves 5 and 6, respectively. These tabs serve as anchors for the ends of the copper strip 9 which is wound about the sleeve 4 as shown to define a helical coil. As shown, the strip 9 is wound with a relatively great turn density at its intermediate portion and a relatively small turn density at its end portions.

In addition to supporting the insulating sleeve 4, the plug 2 has an internally threaded hole which threadedly receives the coiled spring-like support rod 10, this rod defining external threads by reason of its convolutions. A high frequency core member 11 is secured to the end of this rod and within the coil to form a core portion thereof of relatively high permeability in relation to that of air, thus increasing the inductance of the coil. The position of the core longitudinally of the coil may be adjusted by rotating the rod 10.

The resonant or tuning frequency of the coil formed by strip 9 is varied by the low-loss conducting sleeve 12 of copper, aluminum, or similar material which telescopes into the annular space between the core 11 and the insulating sleeve 4. This tuning sleeve is mounted on a spring-like coiled support rod 13 which is like support rod 10 and in turn is threadedly received on a suitable movable carriage member 14 (shown in fragmentary view in Figures 1 and 2). The carriage is connected to calibrated operating mechanism to adjust from one position of tuning to another. Such mechanism may, for example, consist of the mechanism described and claimed in said Jacob, et al. Patent No. 2,533,810.

As the tuning sleeve 12 encircles progressively greater portions of the axial length of the tube 4, flux threading the conductor 9 is cut off by the eddy currents induced therein. This progressively reduces the net effective inductance of conductor 9 and gives rise to tuning action. Since the core is progressively less exposed to the field of the coil as the frequency increases, it exercises progressively decreasing effect on the inductance of the coil and the resonant frequency of the tuner defined thereby.

The core 11 is constructed of a material having magnetic permeability in excess of that of air and relatively low losses at radio frequencies. A material particularly suitable for this purpose comprises a suspension of minute particles or granules of ferromagnetic powdered material in a phenolic resin or similar moldable plastic carrier. These materials are characterized by magnetic permeability greater than that of air and by energy losses when subject to a time varying magnetic field in excess of the losses associated with air. In general, the value of the magnetic permeability can be increased (as by using a more dense suspension of particles of ferromagnetic material) only at the expense of increased energy losses.

The tuning range of the tuner above described is determined at the high frequency end of the range by the degree of magnetic leakage between the conducting sleeve 12 and the winding defined by conductor 9 and by the resistance of the material of sleeve 12. The low frequency limit is determined by the dimensions of the inductor and by the permeability and size of the core 11. It has heretofore been considered possible to increase the range of the tuner only by using core materials of increased permeability, a method that increases this range only at the expense of increased losses incident to the higher permeability core materials.

The use of a capacitor in parallel with the coil is not effective to increase the range of the tuner because the capacitor can only change the resonant or tuning frequency over the entire range of frequencies and at any one setting of the tuning sleeve the resonant frequency changes in the same direction.

Despite the above theoretical ineffectiveness of a capacitor connected to the coil, I have discovered that when a capacitor is connected across only a portion of the turns at the end of the coil into which the tuning sleeve telescopes, the resonant frequency at the low frequency end of the tuning movement is decreased and at the same time the resonant frequency at the high frequency end of the tuning movement is increased. This effect is shown in chart form in Figure 3 which at curve A shows the tuning curve of a television tuner constructed like that of Figures 1 and 2 but with no shunt capacitance and in curve B shows the frequency curve of a like tuner with a small capacitor 14 connected across a portion of the turns of the coil adjacent the end into which the conducting sleeve is moved as shown in Figures 1 and 2.

In an actual television tuner wherein the length of the winding defined by conductor 9 was approximately 1½ inches and the outer diameter of the insulating tube 4 was approximately ¼ inch and constructed as shown in Figures 1 and 2, the range of the tuner was increased five to six megacycles by use of a 100 mmf. capacitor connected across ¾ to one turn of the coil at the end into which the tuning sleeve moves. With a capacitor of from 33 to 47 mmf. connected across the first 2¾ turns at the end of the coil into which the tuning sleeve moves, the range of the tuner was increased from 15 to 20 megacycles. In each case approximately half the increase in tuning range occurred at the low frequency end of the scale and about half at the high frequency end.

It is thought that the capacitor 14 increases the resonant frequency at the high frequency end of the spectrum (contrary to the effect to be expected) because of action as a series capacitor and as a partial short circuit across the tapped part of the winding, thereby removing unwanted inductance from the circuit when tuned to the high frequency end of the scale.

In actual tuners constructed as above described, I have found that the energy losses of the circuit (and hence the Q or selectivity of tuning) are not adversely affected by the action of the additional capacitor. Moreover, it is possible for a given frequency range to provide a tuner of lower loss (and higher Q) than could otherwise be obtained because the capacitor permits the use of lower permeability, lower loss, core material. The use of a lower loss, lower permeability core material also aids in securing uniform sensitivity and selectivity over the tuning range.

In order to avoid undesirable variations in the response curve, particularly any condition wherein the tuner defines a resonant circuit tuned to a frequency carrying an unwanted station, it is desirable to avoid any resonance between the capacitor 14 and the portion of the coil across which it is connected at any station-carrying frequency as the tuner as a whole tunes to a desired station. This characteristic has been achieved in the television tuner by choosing the value of the capacitor 14 in relation to the portion of the coil across which it is connected to resonate at a frequency substantially above the tuning frequency of the tuner as a whole when the sleeve 12 is tuning the low frequency television channels and to fix the resonance of the capacitor and the portion of the coil across which it is connected below the frequencies of the high television band (174 to 213 mc.) when tuning in that band. For example, the unit described above using a 100 mmf. capacitor across ¾ to one turn of the coil gave rise to a tuning curve of the capacitor and the portion of the inductor it is across as shown at curve C, Figure 3. Similarly, the unit using a 33 to 47 mmf. capacitor across 2¾ turns produced the curve D, Figure 3, for the capacitor 14 and the portion of the coil across which it is connected. Each of these curves maintains the resonant frequency of the tapped portion of the coil below the high frequency band when tuning in that band and above the low frequency band when tuning in that band. Since no television stations are in the range of tuning of this portion of the circuit while stations are being tuned by the unit as a whole, there is no tendency to tune to unwanted stations while the television frequency bands are being covered. Because none of the resonances of the tapped portions of the tuner coils fall at the same frequency at any one tuning point, the spurious responses to signals between or outside of the television bands are as low or lower than without the tapped coils. The higher core Q permissible increases the tuner selectivity sufficiently to actually reduce spurious responses.

While I have shown and described specific embodiments of my invention, it will of course be understood that many modifications and alternative constructions may be made without departing from the true spirit and scope thereof. In particular, other combinations of values of the capacitor 13 and the portion of the inductor across which it is connected may be employed to increase the tuning range at both ends. I therefore intend by the appended claims to cover all such modifications and alternative constructions as fall within the true spirit and scope thereof.

What I claim as new and desire to secure by Letters Patent of the United States is:

1. A high frequency tuner characterized by a broad tuning range over spaced low and high frequency bands without undesired responses, the tuner comprising in combination, a helical coil with an intermediate portion of relatively great turn density and end portions of relatively low turn density, a high frequency core fixedly mounted in the coil, a conducting sleeve adapted to telescope over the core and within the coil from one end to tune the coil over the low frequency band while under one of the end portions and over the high frequency band while under both end portions, and a capacitor connected across a portion of the turns of the coil adjacent said one end and adapted to resonate with the portion of the inductor across which it is connected at a frequency below the high frequency band when that band is being tuned by the sleeve and at a frequency above the low frequency band when that band is being tuned by the sleeve.

2. A subcombination adapted to form a high frequency tuner in conjunction with a movable conducting tuning sleeve and characterized by a broad tuning range over spaced low and high frequency bands without undesired responses, the subcombination including a helical coil with an intermediate portion of relatively great turn density and end portions of relatively low turn density, a conducting member adapted to telescope within the coil from one end to tune the coil over the low frequency band while under one of the end portions and over the high frequency band while under both end portions, and a capacitor connected across a portion of the turns of the coil adjacent said one end and adapted to resonate with the portion of the inductor across which it is connected at a frequency above the low frequency band when that band is being tuned by the member and at a frequency below the high frequency band when that band is being tuned by the member.

3. A high frequency tuner characterized by a broad tuning range over spaced low and high frequency bands without undesired responses, the tuner comprising in combination, a helical coil with an intermediate portion of relatively great turn density and end portions of relatively low turn density, a conducting member adapted to telescope over the core and within the coil from one end to tune the coil over the low frequency band while under one of the end portions and over the high frequency band while under both end portions, and a capacitor connected across a portion of the turns of the coil and adapted to resonate with the portion of the inductor across which it is connected at a frequency above the low frequency band when that band is being tuned by the member and a frequency below the high frequency band when that band is being tuned by the member.

HAROLD T. LYMAN.

REFERENCES CITED

The following references are of record in the file of this patent:

UNITED STATES PATENTS

| Number | Name | Date |
|---|---|---|
| 2,533,810 | Jacob, et al. | Dec. 12, 1950 |

FOREIGN PATENTS

| Number | Country | Date |
|---|---|---|
| 292,955 | Great Britain | June 25, 1928 |
| 559,718 | Great Britain | Mar. 2, 1944 |